United States Patent
Straeussnigg

(10) Patent No.: US 10,439,629 B2
(45) Date of Patent: Oct. 8, 2019

(54) METHOD AND DEVICE FOR SIGNAL CONVERTING

(71) Applicant: Infineon Technologies AG, Neubiberg (DE)

(72) Inventor: Dietmar Straeussnigg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/164,015

(22) Filed: Oct. 18, 2018

(65) Prior Publication Data

US 2019/0123753 A1 Apr. 25, 2019

(30) Foreign Application Priority Data

Oct. 24, 2017 (DE) .......................... 10 2017 124 818

(51) Int. Cl.
| | | |
|---|---|---|
| *H03M 1/20* | (2006.01) | |
| *H03M 1/12* | (2006.01) | |
| *H03M 1/18* | (2006.01) | |

(52) U.S. Cl.
CPC ......... *H03M 1/201* (2013.01); *H03M 1/1245* (2013.01); *H03M 1/18* (2013.01)

(58) Field of Classification Search
CPC ...... H03M 1/201; H03M 1/1245; H03M 1/18; H03M 1/167; H03M 1/1028; H03M 1/0687
USPC ................................................. 341/131–155
See application file for complete search history.

(56) References Cited

U.S. PATENT DOCUMENTS

| | | | | |
|---|---|---|---|---|
| 4,857,927 A * | 8/1989 | Takabayashi | ....... | H03M 1/0639 341/131 |
| 5,245,341 A * | 9/1993 | Maeder | ............... | H03M 1/0624 341/131 |
| 5,451,947 A * | 9/1995 | Morrison | ............... | G01R 19/25 341/131 |
| 5,493,298 A * | 2/1996 | Bartz | .................. | H03M 1/0641 341/118 |
| 6,016,113 A * | 1/2000 | Binder | .................. | H03M 1/201 341/120 |
| 6,784,814 B1 * | 8/2004 | Nair | ..................... | H03M 1/0641 341/118 |
| 7,126,519 B1 * | 10/2006 | Xu | ....................... | H03M 1/0626 341/144 |
| 7,277,033 B1 * | 10/2007 | Kriz | ........................ | H03M 1/06 341/131 |
| 2003/0185576 A1 * | 10/2003 | Blake | ..................... | G01R 15/24 398/202 |
| 2010/0073210 A1 * | 3/2010 | Bardsley | ............. | H03M 1/0641 341/131 |
| 2014/0091957 A1 * | 4/2014 | Moldsvor | ........... | H03M 1/0641 341/131 |
| 2017/0041013 A1 * | 2/2017 | Nagarajan | ........... | H03M 1/0641 |
| 2019/0131992 A1 * | 5/2019 | Ali | ...................... | H03M 1/1028 |

* cited by examiner

*Primary Examiner* — Lam T Mai
(74) *Attorney, Agent, or Firm* — Slater Matsil, LLP

(57) ABSTRACT

In accordance with an embodiment, a method includes adding a dither signal to a first signal to generate a second signal, subtracting the dither signal from the first signal or subtracting the first signal from the dither signal to generate a third signal, performing a first sigma delta conversion of the second signal to a digital fourth signal, performing a second signal delta conversion of the third signal to a digital fifth signal, combining the digital fourth signal and the digital fifth signal to form a digital sixth signal.

21 Claims, 4 Drawing Sheets

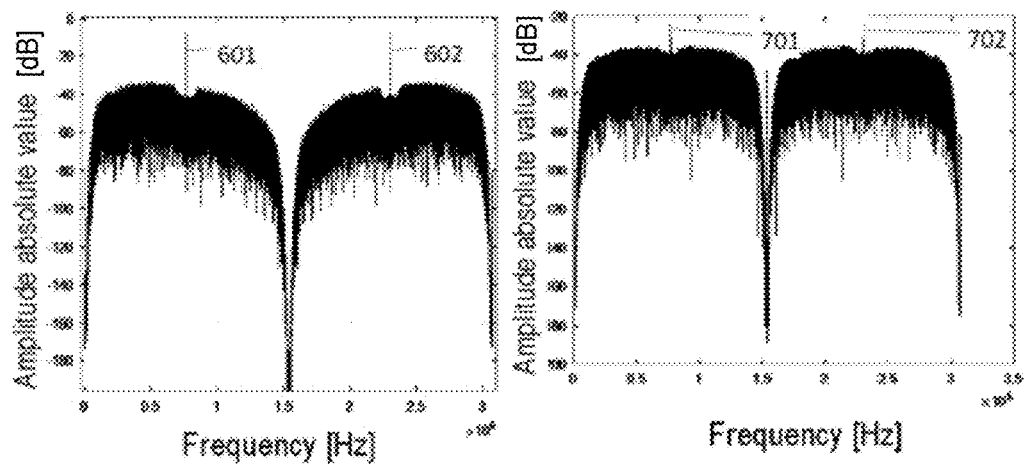
FIG. 6
FIG. 7
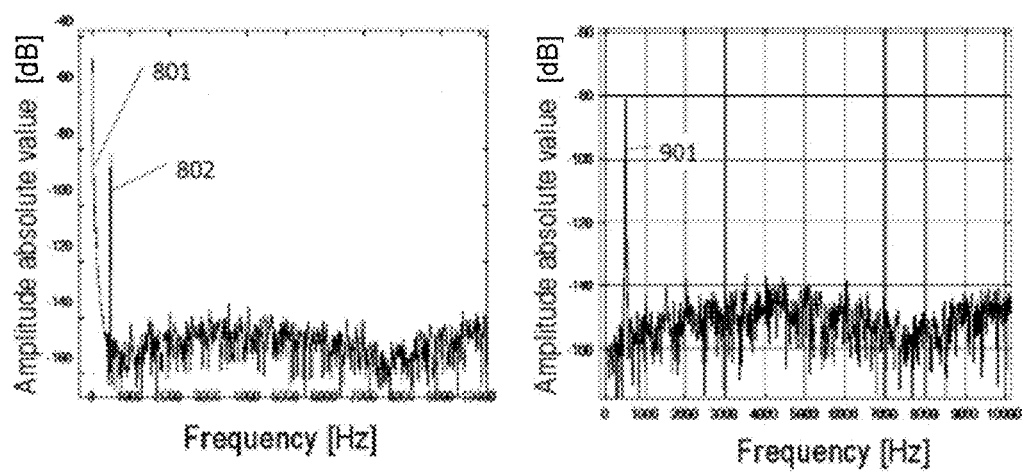
FIG. 8
FIG. 9

METHOD AND DEVICE FOR SIGNAL
CONVERTING

This application claims the benefit of German Application No. 102017124818.8, filed on Oct. 24, 2017, which application is hereby incorporated herein by reference in its entirety.

TECHNICAL FIELD

This disclosure generally relates to a method and a device for signal converting.

BACKGROUND

Noise shaping denotes a method in which noise is concentrated to a greater extent in specific frequency ranges and as a result the noise energy in the frequency spectrum is shifted in a manner that is advantageous for the application. Noise shaping can be carried out by means of so called modulators/noise shapers.

Conventional implementations of digital noise shapers or of analog noise shapers such as are used in analog-to-digital converters (ADCs), for example, exhibit strong interference signals for low input signals, in the case of microphones so called idle tones, which can occur for example at half the sampling frequency of a digitally converted analog signal.

Digital microphones have to provide a 1-bit output stream for many applications, which output stream can be provided by a digital modulator.

By way of example, in stereo applications, an intermodulation of the idle tones can occur, such that an interference signal can occur in the audio band, that is to say in the range audible to human hearing.

In the case of mono applications, too, idle tones can occur, in particular in the case of high loads.

Comparable interference signals can also occur in some applications of analog-to-digital converters.

A conventional procedure in such cases consists in superposing a so called "dither" signal with a signal input of a quantizer of an analog-to-digital converter or modulator used.

In this case, the dither signal can be a periodic or a (pseudo) random signal, which can be realized for example by means of a linear feedback shift register (LFSR). This has the effect that the signal-to-noise ratio (SNR) is improved by the noise added by means of the dither signal in a specific frequency range.

In the microphone application, however, a digital noise shaper is required for generating the abovementioned 1 bit output stream and the conventional approaches are inadequate; employing the procedures mentioned above would lead to an impediment of the signal-to-noise ratio in some cases.

SUMMARY

In accordance with an embodiment, a method includes adding a dither signal to a first signal to generate a second signal, subtracting the dither signal from the first signal or subtracting the first signal from the dither signal to generate a third signal, performing a first sigma delta conversion of the second signal to a digital fourth signal, performing a second signal delta conversion of the third signal to a digital fifth signal, combining the digital fourth signal and the digital fifth signal to form a digital sixth signal.

In accordance with another embodiment, a device includes: a first sigma delta converter having a first conversion input and a first conversion output; a second sigma delta converter having a second conversion input and a second conversion output, wherein the first conversion input and the second conversion input are coupled to an input signal line; a dither generator, which is additively coupled to the first conversion input and is subtractively coupled to the second conversion input; and a combination circuit, which is coupled to the first conversion output and the second conversion output and to an output signal line.

In accordance with a further embodiment, a device includes an adder for adding a dither signal to a first signal in order to generate a second signal; a subtractor for subtracting the dither signal from the first signal or for subtracting the first signal from the dither signal in order to generate a third signal; a first sigma delta converter for converting the second signal to a digital fourth signal; a second sigma delta converter for converting the third signal to a digital fifth signal; and a combination circuit for combining the digital fourth signal and the digital fifth signal to form a digital sixth signal.

In accordance with another embodiment, a microphone includes a sound transducer configured to convert acoustic oscillations into electrical signals and to provide them as a microphone signal; and a device coupled to an output of the sound transducer. The device includes an adder for adding a dither signal to the microphone signal in order to generate a second signal; a subtractor for subtracting the dither signal from the microphone signal or for subtracting the microphone signal from the dither signal in order to generate a third signal; a first sigma delta converter for converting the second signal to a digital fourth signal; a second sigma delta converter for converting the third signal to a digital fifth signal; and a combination circuit for combining the digital fourth signal and the digital fifth signal to form a digital output signal of the device.

The above summary should be understood merely as a brief overview of some possible implementations and should not be interpreted as restrictive. In particular, other exemplary embodiments can use features other than those explained above.

BRIEF DESCRIPTION OF THE DRAWINGS

FIG. 6 shows a simulated fast Fourier transform (FFT) spectrum with strong idle tone;

FIG. 7 shows a simulated FFT spectrum with reduced idle tone in accordance with one exemplary embodiment;

FIG. 8 shows a simulated FFT spectrum of an individual modulator output in accordance with one exemplary embodiment; and FIG. 9 shows a simulated FFT spectrum of an output signal in accordance with one exemplary embodiment.

DETAILED DESCRIPTION OF ILLUSTRATIVE EMBODIMENTS

Figure 1:
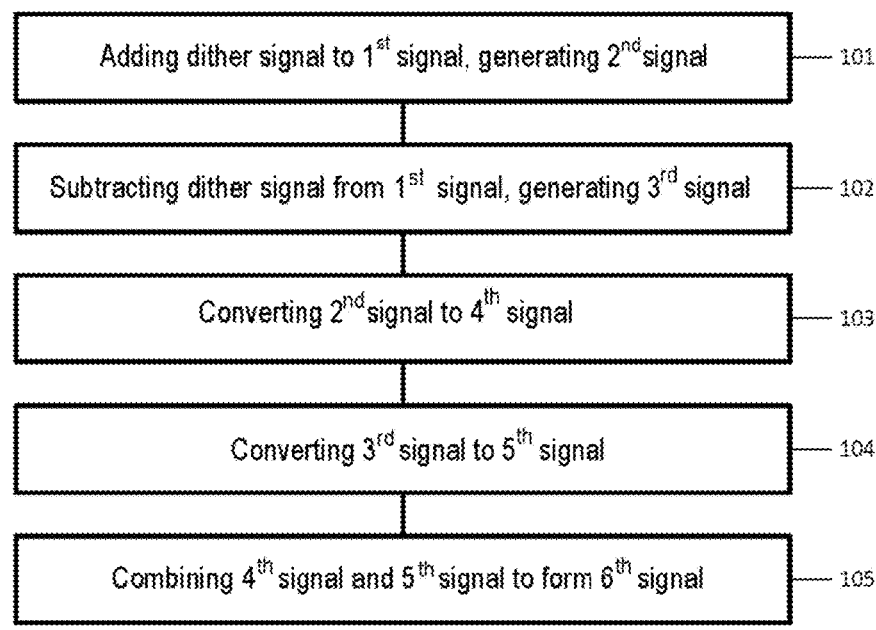
FIG. 1 shows a flow diagram of a method in accordance with one exemplary embodiment.

Various exemplary embodiments are described in detail below with reference to the accompanying drawings. These exemplary embodiments should be regarded merely as an example and should not be interpreted as restrictive. By way of example, in other exemplary embodiments some of the features or components described can be omitted and/or be replaced by alternative features or components. Features or components of different exemplary embodiments can be combined in order to form further exemplary embodiments. Variations and modifications described with regard to one exemplary embodiment can also be applied to other exemplary embodiments. Furthermore, features or components other than those described or shown can be provided, for example features or components used in conventional bandgap circuits or circuits for generating a reference voltage.

Direct connections or couplings that are shown in the drawings or described below, i.e. electrical connections or couplings without intervening elements (for example simple metal conductor tracks), can also be realized by an indirect connection or coupling, i.e. a connection or coupling that comprises one or more additional intervening elements, and vice-versa, as long as the general functioning of the connection or coupling, for example providing a voltage, providing a current or providing a control signal, is substantially maintained.

A connection or coupling can be implemented in wired or wireless fashion. Functional units can be implemented as hardware, software or a combination of hardware and software.

In the figures, identical reference signs designate identical or similar elements. The figures are schematic representations of various exemplary embodiments. Elements illustrated in the figures are not necessarily illustrated in a manner true to scale. Rather, the various elements illustrated in the figures are reproduced in such a way that their function and general purpose become understandable to the person skilled in the art.

The techniques described can be used in various fields of application. By way of example, converting, as described below, can be used in association with measurement techniques in which one analog input signal is received by one sensor or a plurality of input signals are received by a plurality of sensors. The sensor itself or the sensors themselves can also comprise converters, which can then provide a digital signal as input signal or input signals. The input signal or the input signals is or are then typically indicative of one or more physical observables. By way of example, the converting can be used in association with microphones which map ambient noises in the input signal for example on the basis of a pressure sensor.

In some exemplary embodiments, the converting in this case comprises an analog-to-digital conversion (ADC).

Exemplary embodiments described hereinafter and hereinabove can use dither signal.

A dither signal in the context of the present application can be an analog or digital signal. The dither signal can be random or have a periodicity. In the case of a periodicity, the frequency with which the dither signal is repeated is referred to as dither frequency in the context of this application. A periodic dither signal can have for example a sinusoidal shape, a sawtooth shape or arbitrary combinations of periodic signals. A random dither signal can likewise be generated pseudo randomly. In one embodiment variant, it can be realized for example by means of a linear feedback shift register (LFSR).

The dither frequency can be chosen in relation to a useful frequency and/or a useful frequency range (useful range hereinafter) of the application, for example with respect to an input signal. By way of example, the dither frequency of a periodic dither signal can be chosen to be below a lower useful frequency. Other frequencies in relation to the useful range are also conceivable. By way of example, the dither frequency of the periodic dither signal can also be chosen to be greater than the upper useful frequency that is to say above the useful range, of the first signal. In some applications, the dither frequency can also be chosen to be within the useful frequency range.

In the context of this application, the useful range of a signal is understood to mean a range which can be described by a lower useful frequency and an upper useful frequency. The useful range of the signal then lies between the lower useful frequency of the input signal and the upper useful frequency of the input signal. In the case of use for audio signals for human hearing, upper and lower useful frequencies can be oriented to the range of the spectrum that is able to be perceived by human hearing. By way of example, a chosen useful range can extend from 20 Hz to 20 kHz.

In this case, the dither frequency can be chosen to be in the region of ~1 Hz, for example. However, as explained above, it can also assume other values, in the audible range, or be chosen to be above the audible range.

In the case of uses for other purposes or else also in the audio range, other useful ranges and/or only partial ranges of the examples mentioned above are also possible as useful range.

In some exemplary embodiments, a part of the method or of the device can operate at a first sampling frequency (operating frequency). Said first sampling frequency can be reduced vis-à-vis the original sampling frequency and/or vis-à-vis a second sampling frequency (intermediate frequency) of an intermediate signal that is output.

In the context of this application, converting should be understood to mean that a signal A is converted to a signal B having a different signal format than the signal A.

In particular, the different signal format may consist in the signal A being an analog signal and the signal B being a digital signal having a bit width and a sampling frequency, or in the signal A being a first digital signal having a first bit width and a first sampling frequency and the signal B being a second digital signal having a second bit width and/or second sampling frequency deviating from the signal A.

In some exemplary embodiments, at least one converting process takes place. In the case of a digital signal, the converting can comprise for example converting a bit stream having n>=2 bits to a bit stream having n=1-bit. This can be realized for example with a digital modulator. In the case of an analog input signal, for example in an analog-to-digital converter (ADC), an analog signal can be converted to a digital signal, for example to a 1-bit stream. In this case, the converting can be realized for example with an nth order sigma delta analog-to-digital converter. By way of example, n=1 or n=5 can be chosen, but other values for n are also possible.

A combination element configured for the combining or a combination circuit is understood to mean an element or a circuit which has two inputs for a first input digital signal C and a second input digital signal D and an output for an output digital signal E, wherein E is provided by the combination element as a function of C and D.

The sampling frequency of the input digital signals C and D and of the output digital signal E can be different in this case.

The sampling frequency of the output digital signal E can correspond to the sum or a multiple of the sum of the input digital signals C and D. The sampling frequency of first input digital signal C and second input digital signal D can be identical.

Combining the first and second input digital signals C and D can be carried out as alternate combining. This case involves alternately taking a number of bits of the input digital signal C, then the same number of bits of the input digital signal D and combining them to form an output signal E. In the case of the alternate combining, in particular an output signal having double the frequency of the input digital signals C and D can be achieved by alternate combining.

Alternatively, the combining can be similar to the mode of operation of a repeater; in this regard, by way of example, a signal E can be generated by combining signals C and D and by repeating subsignals of the signals C and D. By way of example, a single sample or a number of samples can be chosen as subsignal of a signal. In the case of a 1-bit stream, the samples are single bits.

By way of example, an output signal E of the combiner having quadruple the frequency of the signals C and D can be generated by combining, for example alternately combining, subsignals and repeating values of subsignals of the input signals C and/or D.

If the first signal yields the samples C1, C2, and the second signal the samples D1, D2, in each case having a first sampling frequency for a defined time interval T, then the combining can output an output signal E having double the sampling frequency of the first sampling frequency C1|D1|C2|D2 for the same time interval T, or having quadruple the initial frequency of the first sampling frequency e.g. with C1|D1|C1|D1|C2|D2|C2|D2 for the same time interval T. This should be understood to be merely by way of example and not as restrictive.

The terms adding and subtracting, and adder and subtractor should be understood to be functional and relate to processes and devices in which the desired effect corresponding to an addition or a subtraction is achieved as the result.

Adding a signal F to a signal G, in the case of analog signals, for example, should be understood to mean superposing signal F and signal G. In the case of digital signals having the same sampling frequency, adding should be understood to mean for example adding the digital values.

Subtracting a signal I from a signal H, in the case of analog signals, for example, should be understood to mean superposing signal H and signal B, wherein I is provided with a negative sign. In the case of digital signals having the same sampling frequency, subtracting should be understood to mean subtracting the digital values of signal I from signal H.

Alternatively, by way of example, a subtraction can also be achieved by using a phase shift between two periodic signals together with an addition, which brings about a result substantially identical to an addition/subtraction, without a subtractor/subtracting being involved. This can be achieved for example by means of a multi-phase oscillator. The same applies for example to an inverter and similar known devices that can be used to bring about an effect corresponding to an addition or subtraction. By way of example the effect of an addition and a subtraction can also be achieved by the use of two adding steps, with one adding step being linked with a change of sign ("inverting"). The use of the terms adding and subtracting and of the device adder and subtractor should be understood in this sense and extends to all equivalent possibilities for achieving the results described.

FIG. 1 shows a flow diagram of a method in accordance with one exemplary embodiment.

The order of the method processes described need not necessarily correspond to the temporal sequence of the method processes. Method processes can also proceed simultaneously or in an order that does not correspond to the order of numbering.

Firstly, step 101 involves adding a dither signal to a first signal and generating a second signal as a result. The first signal can be for example a digital or analog signal coming from a sensor. Step 102 involves subtracting the same dither signal from the first signal and generating a third signal as a result.

In various exemplary embodiments, the first signal can be present in either digital or analog form. In digital form it can be digitized in the form of a bit stream having a bit width of n>1-bits.

The second and third signals generated can likewise be analog or digital depending on the exemplary embodiment.

Step 103 involves converting the second signal to a digital fourth signal. Step 104 involves converting the third signal to a digital fifth signal. In the case of analog second and third signals, the converting here comprises digitizing. The first converting 103 and the second converting 104 can be a converting process as described above.

Step 105 involves combining fourth signal and fifth signal to form a sixth signal.

The combining can have the effect that the sixth signal no longer contains the dither signal. This can be advantageous since the dither signal, even in the case where it is chosen to be outside a useful range, can have a disturbing effect for downstream signal processing stages and/or can generate signals in other frequency ranges by intermodulation.

In one exemplary embodiment of the method, the digital fourth signal and/or the digital fifth signal and/or the digital sixth signal can be a 1 bit stream.

In this case, in some exemplary embodiments, the converting in step 103 and the converting in step 104 can correspond to one another.

Converting of two converting processes or converting units that proceeds correspondingly should be understood to mean that the results of the converting processes or the output signals of the converting unit given an identical input correspond to one another, i.e., are substantially indistinguishable.

This can be achieved for example by the use of identical or virtually identical converters or converting processes.

In a further exemplary embodiment, the digital fourth signal and the digital fifth signal can have a first sampling frequency and the digital sixth signal can have a second sampling frequency. In this case, the first sampling frequency can be lower than the second sampling frequency.

In a further embodiment variant, the second sampling frequency can be an integral multiple of double the first sampling frequency.

In exemplary embodiments, the second sampling frequency can be double or quadruple the frequency of the first sampling frequency.

Figure 2:
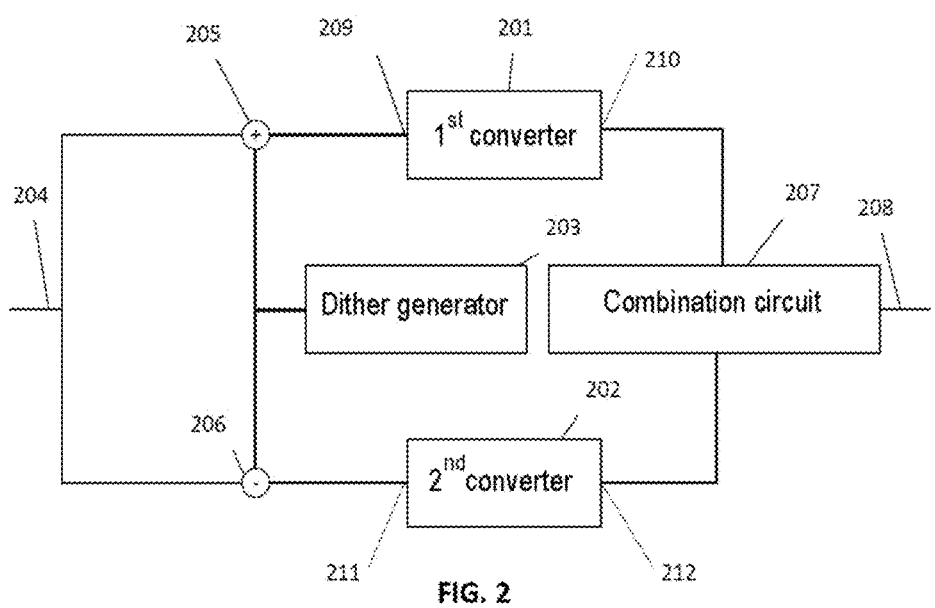
FIG. 2 schematically illustrates a circuit in accordance with various exemplary embodiments.

FIG. 2 schematically illustrates a circuit for signal converting in accordance with various exemplary embodiments.

In the case of the circuit in FIG. 2, a signal line 204 conducts a first signal to an adder 205 configured to carry out an addition, and to a subtractor 206 configured to carry out a subtraction. A dither generator 203 generates a dither signal, which is provided to the adder 205 and the subtractor 206. In the adder 205, the dither signal is added to the first signal and a second signal is generated, which is provided to the first converter 201 at a first conversion input 209. The subtractor 206 correspondingly provides a third signal to a second converter 202 at a second conversion input 211. The first converter 201 converts the second signal to a digital fourth signal and outputs the latter at a first conversion output 210; the second converter 202 converts the third signal to a digital fifth signal and outputs the latter at a second conversion output 212. The digital fourth signal and the digital fifth signal are provided to a combination circuit 207. The combination circuit 207 combines the digital fourth signal and the digital fifth signal to form a digital sixth signal. The digital sixth signal is provided for further processing by means of the output signal line 208.

In a variant of the exemplary embodiment shown in FIG. 2, the subtractor 206 can also subtract the first signal from the dither signal in order to form the third signal. In this case, the fifth signal is then inverted before being combined with the fourth signal, which produces substantially the same sixth signal as in FIG. 2. With regard to the converting processes, the signals, the dither signal and the combination circuit as described in this example, the general explanations above are applicable here as well.

Figure 3:
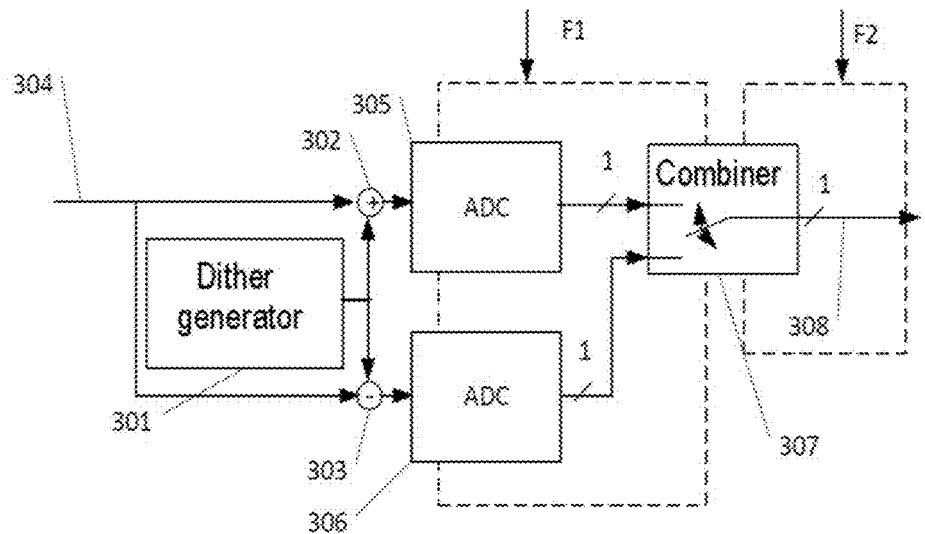
FIG. 3 schematically illustrates a circuit in accordance with various exemplary embodiments.

FIG. 3 schematically illustrates a circuit in accordance with various exemplary embodiments. A dither generator 301 provides an analog dither signal to an adder 302 and to a subtractor 303. The adder 302 and the subtractor 303 combine the dither signal with a first signal provided in a signal line 304. In accordance with the exemplary embodiments described here, the first signal is present in analog form. The signal combined in the adder 302 is provided to a first ADC 305. The signal combined in the subtractor 303 is provided to a second ADC 306. First ADC 305 and second ADC 306 have a first sampling rate F1. In the exemplary embodiment illustrated in FIG. 3, first ADC 305 and second ADC 306 each yield a 1-bit stream as output signal. The two bit streams are provided to a combiner 307. In the combiner, an output signal 308 is generated from the two bit streams having the sampling frequency F1 by alternate combining or by some other suitable method, which output signal is a 1-bit stream having a sampling frequency F2 in this exemplary embodiment. In this case, F2 can be a multiple of F1. By way of example, F2 can have double the value of F1. In a further exemplary embodiment, F2 can have quadruple the value of F1, but other combinations are also possible.

Figure 4:
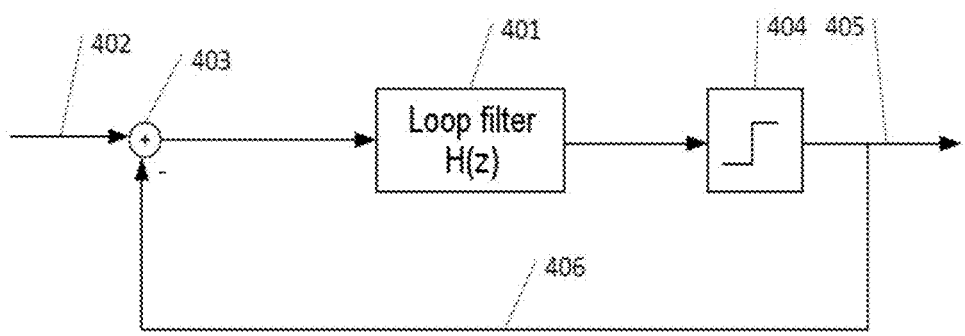
FIG. 4 schematically illustrates a digital modulator in accordance with various exemplary embodiments.

FIG. 4 schematically illustrates a digital modulator in accordance with various exemplary embodiments.

FIG. 4 shows an nth order digital modulator. A digital modulator or digital noise shaper can be used for converting, as shown for example in FIG. 1, 103, 104, or as a converter, as shown for example in FIG. 2 (201, 202) and below in FIG. 5.

An input signal 402 having a bit width m>1 is connected to a loop filter 401 by means of a subtractor 403. The order of the loop filter 401 determines the order n of the modulator. An output of the loop filter is provided to a quantizer 404. The output signal of the quantizer 404 on the one hand forms the output signal 405, and on the other hand the output signal is provided to the subtractor 403 by means of a feedback line 406 and is subtracted from the input signal 402.

Figure 5:
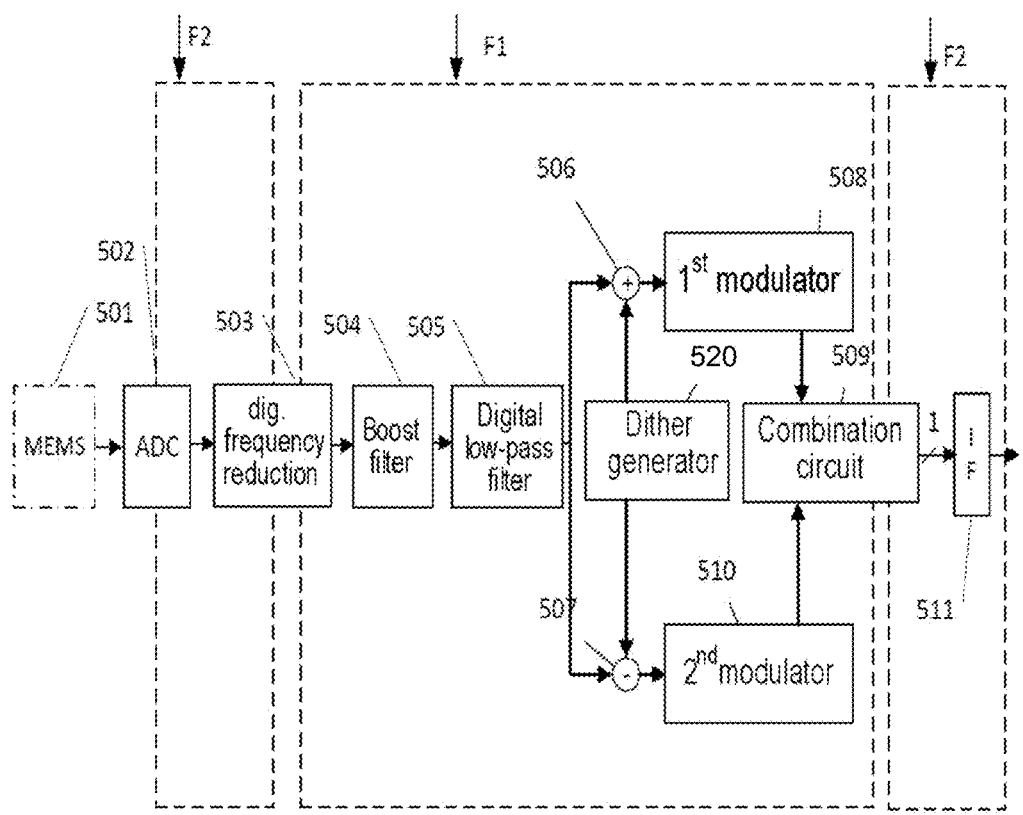
FIG. 5 schematically illustrates one possible implementation of the circuit in accordance with FIG. 2 in accordance with various exemplary embodiments.

FIG. 5 schematically illustrates one possible implementation of the circuit in accordance with FIG. 2 in accordance with various exemplary embodiments.

In the variant shown in FIG. 5, an analog input signal is provided by a MEMS system 501. The MEMS system 501 can form a sound transducer configured to convert acoustic oscillations into electrical signals and to provide them as a microphone signal. As explained above with regard to measurement techniques, however, other input signals are also possible. The input signal is digitized by an ADC 502. In this case, the ADC 502 uses a sampling rate F2 for the digitization. In 503, the frequency of the digital signal is reduced to a lower frequency F1. The signal passes through a boost filter 504 followed by a digital low pass filter 505.

A boost filter 504 can be a filter having a negative group delay time, which has a flat amplitude response in the passband and amplifies higher frequencies and is designed in cooperation with the digital low pass filter 505 such that the (positive) group delay time of signals passing through the filter is as short as possible in the cooperation of boost filter and low pass filter.

The output signal of the digital low pass filter is provided in each case to an adder 506 and a subtractor 507. A dither generator 520 generates a dither signal, which is provided in each case to the adder 506 and the subtractor 507. The signal combined in the adder 506 is provided to a first modulator 508. The latter modulates the signal and provides the modulated signal to a combination circuit 509. The signal thus provided from the subtractor 507 is provided to a second modulator 510. The output signal of the second modulator 510 is likewise provided to the combination circuit 509. The combination circuit combines the two signals to form a 1 bit stream. This generated 1 bit stream once again has the sampling frequency F2 and can be provided as an intermediate signal, IF 511, for further processing.

FIG. 6 shows a simulated FFT spectrum with a strong idle tone (601; 602). This can correspond to the intermediate signal 511 of the device from FIG. 5 without a dither signal.

In this case, the amplitude absolute value in decibels is plotted as a function of frequency. FIG. 6 shows a simulated spectrum for a known microphone construction. A strong idle tone (601; 602) having an amplitude of 8 dBFS is clearly discernible in the spectrum. Such an idle tone (601; 602) can produce an unpleasant hearing impression for a user and/or possibly disturb downstream further signal processing stages, for example voice recognition.

FIG. 7 shows a simulated FFT spectrum with reduced idle tone (701; 702) in accordance with one exemplary embodiment, e.g. the intermediate signal 511 of the device from FIG. 5 with dither signal. FIG. 7 likewise shows a simulated spectrum. This simulated spectrum may have been obtained for example at the signal output IF 511 in FIG. 5. In the case shown in FIG. 7, a sine having a frequency of 0.5 Hz was used as dither signal. The idle tone (701; 702) is significantly reduced to 24 dBFS. The dither signal cannot be seen in the spectrum shown.

FIG. 8 and FIG. 9 show simulated FFT spectra which were obtained for an exemplary embodiment at different positions of the device.

FIG. 8 shows a simulated FFT spectrum of a single modulator output in accordance with one exemplary embodiment. The data for the spectrum illustrated may have been obtained for example at the output of the first modulator 508 in FIG. 5. In the low frequency range below 1000 Hz, a dither peak 801 is clearly discernible on account of the sinusoidal dither signal. As in the case shown in FIG. 7, a sinusoidal signal having a frequency of 0.5 Hz was used as dither signal in FIG. 8 as well. The peak width of the dither peak 801 in the spectrum is an artifact on account of the number of simulation values used for calculating the spectrum. A tone at 500 Hz was simulated as simulated useful signal. Said tone is likewise clearly discernible in the spectrum as a useful signal peak 802.

FIG. 9 shows a simulated FFT spectrum of an output signal in accordance with one exemplary embodiment. This spectrum may be for example the output signal of the combination circuit 509 in FIG. 5. As is clearly discernible in the low frequency range below 1000 Hz, the dither signal is no longer detectable. This may be advantageous for the further signal processing since further processing steps, for example voice recognition in the case of microphones, can be adversely influenced by signals even outside the audible range. Removing the dither signal likewise makes it possible to prevent audible components of the dither signal from occurring in the output signal as a result of intermodulation. The simulated tone having a frequency of 500 Hz as in FIG. 8, by contrast, is discernible in the spectrum without change as a useful signal peak 901.

What is claimed is:

1. A method comprising:
adding a dither signal to a first signal to generate a second signal;
subtracting the dither signal from the first signal or subtracting the first signal from the dither signal to generate a third signal;
performing a first sigma delta conversion of the second signal to a digital fourth signal;
performing a second signal delta conversion of the third signal to a digital fifth signal; and
combining the digital fourth signal and the digital fifth signal to form a digital sixth signal.

2. The method as claimed in claim 1, wherein at least one of the digital fourth signal, the digital fifth signal, or the digital sixth signal is a 1 bit stream.

3. The method as claimed in claim 1, wherein the performing the first sigma delta conversion and the performing the second signal delta conversion proceed correspondingly.

4. The method as claimed in claim 1, wherein the digital fourth signal and the digital fifth signal have a first sampling frequency and the digital sixth signal has a second sampling frequency, wherein the first sampling frequency is lower than the second sampling frequency.

5. The method as claimed in claim 4, wherein the second sampling frequency is an integral multiple of double the first sampling frequency.

6. The method as claimed in claim 1, wherein the dither signal is a periodic signal.

7. The method as claimed in claim 6, wherein a dither frequency of the dither signal is less than a lower useful frequency of the first signal.

8. The method as claimed in claim 1, wherein the performing the first sigma delta conversion and the performing the second signal delta conversion comprise
either converting an analog signal into a digital signal; or
converting a digital signal from a first bit width to a second bit width.

9. The method as claimed in claim 1, wherein the combining comprises alternately combining the digital fourth signal and the digital fifth signal.

10. A device comprising:
a first sigma delta converter having a first conversion input and a first conversion output;
a second sigma delta converter having a second conversion input and a second conversion output;
wherein the first conversion input and the second conversion input are coupled to an input signal line;
a dither generator, which is additively coupled to the first conversion input and is subtractively coupled to the second conversion input; and
a combination circuit, which is coupled to the first conversion output and the second conversion output and to an output signal line.

11. A device comprising:
an adder for adding a dither signal to a first signal in order to generate a second signal;
a subtractor for subtracting the dither signal from the first signal or for subtracting the first signal from the dither signal in order to generate a third signal;
a first sigma delta converter for converting the second signal to a digital fourth signal;
a second sigma delta converter for converting the third signal to a digital fifth signal; and
a combination circuit for combining the digital fourth signal and the digital fifth signal to form a digital sixth signal.

12. The device as claimed in claim 11, wherein the first sigma delta converter and the second sigma delta converter correspond to one another.

13. The device as claimed in claim 11, wherein the first sigma delta converter and the second sigma delta converter are configured to convert either an analog signal into a digital signal or a digital signal from a first bit width to a second bit width.

14. The device as claimed in claim 11, wherein at least one of the digital fourth signal, the digital fifth signal, or the digital sixth signal is a 1 bit stream.

15. The device as claimed in claim 11, wherein the digital fourth signal and the digital fifth signal have a first sampling frequency and the digital sixth signal has a second sampling frequency, wherein the first sampling frequency is lower than the second sampling frequency.

16. The device as claimed in claim 15, wherein the second sampling frequency is an integral multiple of double the first sampling frequency.

17. The device as claimed in claim 11, wherein the dither signal is a periodic signal.

18. The device as claimed in claim 17, wherein a dither frequency of the dither signal is less than a lower useful frequency of the first signal.

19. The device as claimed in claim 11, wherein the combination circuit is configured to carry out a process of alternately combining the digital fourth signal and the digital fifth signal.

20. The device as claimed in claim 11, wherein the first sigma delta converter and the second sigma delta converter each comprise a digital modulator.

21. A microphone comprising:
a sound transducer configured to convert acoustic oscillations into electrical signals and to provide them as a microphone signal; and
a device coupled to an output of the sound transducer, the device comprising
an adder for adding a dither signal to the microphone signal in order to generate a second signal,
a subtractor for subtracting the dither signal from the microphone signal or for subtracting the microphone signal from the dither signal in order to generate a third signal,
a first sigma delta converter for converting the second signal to a digital fourth signal,
a second sigma delta converter for converting the third signal to a digital fifth signal, and a combination circuit for combining the digital fourth signal and the digital fifth signal to form a digital output signal of the device.

\* \* \* \* \*